(12) United States Patent
Nishiyama et al.

(10) Patent No.: US 6,725,325 B2
(45) Date of Patent: Apr. 20, 2004

(54) SEMICONDUCTOR MEMORY DEVICE HAVING A DOUBLE DATA RATE (DDR) MODE AND UTILIZING A PLURALITY OF COMPARISON CIRCUITS TO PREVENT ERRORS DUE TO A LATE WRITE FUNCTION (75) Inventors: Masahiko Nishiyama, Ome (JP); Kinya Mitsumoto, Tamamura (JP); Takeshi Agari, Higashimurayama (JP)

(73) Assignee: Renesas Technology Corp., Tokyo (JP)

( * ) Notice: Subject to any disclaimer, the term of this patent is extended or adjusted under 35 U.S.C. 154(b) by 111 days.

(21) Appl. No.: 10/005,361

(22) Filed: Dec. 7, 2001

(65) Prior Publication Data

US 2002/0071332 A1 Jun. 13, 2002

(30) Foreign Application Priority Data

Dec. 7, 2000 (JP) ........................................ 2000-372243

(51) Int. Cl.$^7$ .......................... G06F 13/00; G06F 13/28; G11C 11/408
(52) U.S. Cl. .................. 711/104; 711/167; 365/189.07; 365/233
(58) Field of Search ............................... 711/104, 167; 365/233, 189.07

(56) References Cited

U.S. PATENT DOCUMENTS

| 6,011,751 | A | * | 1/2000 | Hirabayashi et al. | ........ 365/236 |
| 6,118,729 | A | * | 9/2000 | Hirabayashi et al. | ........ 365/233 |
| 6,134,180 | A | * | 10/2000 | Kim et al. | ................... 365/233 |
| 6,356,504 | B1 | * | 3/2002 | Kim | ...................... 365/230.06 |

FOREIGN PATENT DOCUMENTS

JP          11-195296          7/1999

* cited by examiner

Primary Examiner—Glenn Gossage
(74) Attorney, Agent, or Firm—Antonelli, Terry, Stout & Kraus, LLP (57) ABSTRACT A semiconductor memory device having a double data rate (DDR) mode includes a first comparison logic circuit comparing the lower bits of a specified memory address for a reading operation with the lower bits of a specified memory address for a preceding writing operation, a second comparison logic circuit detecting if bits other than the lower bits match, and a third comparison logic circuit detecting that, when a match is obtained from the second comparison logic circuit, the lower bits of the specified memory address or a secondary memory address such as a burst address for the reading operation match the lower bits of the specified memory address or secondary memory address for the preceding writing operation. The device may have a late write function and a register may be provided to latch single data rate (SDR)/DDR mode information.

10 Claims, 8 Drawing Sheets

CHANGE OF INTERLEAVE BURST MODE ADDRESS

|  | CASE1 | | CASE2 | | CASE3 | | CASE4 | |
|---|---|---|---|---|---|---|---|---|
|  | SA1 | SA0 | SA1 | SA0 | SA1 | SA0 | SA1 | SA0 |
| EXTERNAL INPUT ADDRESS | 0 | 0 | 0 | 1 | 1 | 0 | 1 | 1 |
| INTERNALLY GENERATED ADDRESS | 0 | 1 | 0 | 0 | 1 | 1 | 1 | 0 |

FIG. 3B

CHANGE OF LINEAR BURST MODE ADDRESS

|  | CASE1 | | CASE2 | | CASE3 | | CASE4 | |
|---|---|---|---|---|---|---|---|---|
|  | SA1 | SA0 | SA1 | SA0 | SA1 | SA0 | SA1 | SA0 |
| EXTERNAL INPUT ADDRESS | 0 | 0 | 0 | 1 | 1 | 0 | 1 | 1 |
| INTERNALLY GENERATED ADDRESS | 0 | 1 | 1 | 0 | 1 | 1 | 1 | 0 |

FIG. 4

|  | WRITE | READ |
|---|---|---|
| INTERLEAVED BURST | DDR | DDR |
|  | DDR | SDR |
|  | SDR | DDR |
|  | SDR | SDR |
| LINEAR BURST | DDR | DDR |
|  | DDR | SDR |
|  | SDR | DDR |
|  | SDR | SDR |

FIG. 5
MATCH LOGIC IN LINEAR BURST MODE

| W-Reg | R-Reg | | SA10(W) | SA10(R) | | MATCH (0) | MATCH (1) |
|---|---|---|---|---|---|---|---|
| DDR | DDR | a | 00 | 00 | SA1,SA0 MATCH WHEN COMPARED | 1 | 1 |
| | | | 01 | 01 | | | |
| | | | 10 | 10 | | | |
| | | | 11 | 11 | | | |
| | | c | 00 | 11 | SA1,SA0 NOT MATCH WHEN COMPARED | 1 | 0 |
| | | | 01 | 10 | | | |
| | | | 10 | 01 | | | |
| | | | 11 | 00 | | | |
| | | d | 00 | 01 | (SA1, MATCH WHEN COMPARED) & (SA0 NOT MATCH WHEN COMPARED) | 0 | 1 |
| | | | 01 | 00 | | | |
| | | | 10 | 11 | | | |
| | | | 11 | 10 | | | |
| | | b | 00 | 10 | | 0 | 0 |
| | | | 01 | 11 | | | |
| | | | 10 | 00 | | | |
| | | | 11 | 01 | | | |
| DDR | SDR | c | 00 | 00 | (SA1,SA0 MATCH WHEN COMPARED) OR (SA1,SA0 NOT MATCH WHEN COMPARED) & (SA0 FOR R='0') | 1 | 0(φ) |
| | | | 01 | 10 | | | |
| | | | 10 | 10 | | | |
| | | | 11 | 00 | | | |
| | | d | 00 | 01 | (SA1 MATCH WHEN COMPARED) & (SA0 FOR R='1') | 0(φ) | 1 |
| | | | 01 | 01 | | | |
| | | | 10 | 11 | | | |
| | | | 11 | 11 | | | |
| | | b | 00 | 10 | | 0 | 0 |
| | | | 00 | 11 | | | |
| | | | 01 | 00 | | | |
| | | | 01 | 11 | | | |
| | | | 10 | 00 | | | |
| | | | 10 | 01 | | | |
| | | | 11 | 01 | | | |
| | | | 11 | 10 | | | |
| SDR | DDR | c | 00 | 00 | (SA1,SA0 MATCH WHEN COMPARED) OR (SA1,SA0 NOT MATCH WHEN COMPARED) & (SA0 FOR W='0') | 1 | 0 |
| | | | 00 | 11 | | | |
| | | | 10 | 01 | | | |
| | | | 10 | 10 | | | |
| | | d | 01 | 00 | SA1 MATCH WHEN COMPARED SA0 FOR W='1' | 0 | 1 |
| | | | 01 | 01 | | | |
| | | | 11 | 10 | | | |
| | | | 11 | 11 | | | |
| | | b | 00 | 01 | | 0 | 0 |
| | | | 00 | 10 | | | |
| | | | 01 | 10 | | | |
| | | | 01 | 11 | | | |
| | | | 10 | 00 | | | |
| | | | 10 | 11 | | | |
| | | | 11 | 00 | | | |
| | | | 11 | 01 | | | |
| SDR | SDR | a | 00 | 00 | SA1,SA0 MATCH WHEN COMPARED | 1 | 1 |
| | | | 10 | 10 | | | |
| | | | 01 | 01 | | | |
| | | | 11 | 11 | | | |
| | | b | 00 | 01 | | 0 | 0 |
| | | | 00 | 10 | | | |
| | | | 00 | 11 | | | |
| | | | 01 | 00 | | | |
| | | | 01 | 10 | | | |
| | | | 01 | 11 | | | |
| | | | 10 | 00 | | | |
| | | | 10 | 01 | | | |
| | | | 10 | 11 | | | |
| | | | 11 | 00 | | | |
| | | | 11 | 01 | | | |
| | | | 11 | 10 | | | |

SEMICONDUCTOR MEMORY DEVICE HAVING A DOUBLE DATA RATE (DDR) MODE AND UTILIZING A PLURALITY OF COMPARISON CIRCUITS TO PREVENT ERRORS DUE TO A LATE WRITE FUNCTION

BACKGROUND OF THE INVENTION

The present invention relates to a semiconductor memory device having an internal address generation function and late write function such as DDR (double data rate) SRAM (static random access memory), and to a data processing system utilizing this semiconductor memory device as a main memory or cache memory.

The clock-sync type SRAM of SDR (single data rate) reads or writes one piece of data in each clock cycle. The read operation is started by supplying an address signal from the outside, but data is not actually read out until the read operation is settled. The operation of writing to memory cells is started by supplying write data and a write address. At this time, a fast SRAM of short access cycle utilizes the late write function so that the read out data and the write data fed from the outside in the next memory cycle cannot collide with each other at an IO (input/output) pin. The late write function enables the operation that in a write cycle the write data is fed in the last part of the write cycle, and the write data and write address fed from the outside in that write cycle are stored in latch circuits, and in the next write cycle the latched data is written in the latched address. Thus, under the use of this late write function, when the read operation is ordered to read data at the same address as the latched address stored in the late write register, the latched data in that late write register is read out since the data at this address is not yet written in the memory cells.

The clock-sync type SRAM of DDR (double data rate) in the read cycle receives an external address and internally generates a burst address as the subsequent address at each clock cycle, and it reads data in parallel from each of the external address and burst address of a memory array and serially supplies the read data to the outside in synchronism with the 1/2 cycle of the clock signal. In the write cycle, the write data serially fed in synchronism with the 1/2 cycle of the clock signal are written in parallel in the memory array on the basis of the external address and burst address.

SUMMARY OF THE INVENTION

However, the present inventor discovered that the late write function in the DDR clock-sync type SRAM may cause error when also used in the SDR clock-sync type SRAM without change. In other words, if the latched data in the late write register is read out only when the read address coincides with the external address latched in the late write register as in the SDR type, data will be read out incorrectly from the memory cell array on the data associated with the burst address that is to be rewritten, but not yet rewritten. In short, even though the read address coincides with the burst address in the previous write cycle, the data associated with the burst address that matches with the read address must be read out.

The DDR clock-sync type SRAM is described. in JP-A-11-195296. In this document, the external address and burst address are grasped from the standpoint of even address and odd address, and the burst address is generated by use of a counter. Then, the burst address is also compared directly with the external address in order to prevent the above wrong operation.

However, since the burst address internally generated from the standpoint of even/odd address is used in the technique of the above document, storage means for holding the burst address is additionally needed. Also, since the even/odd of the burst address varies according to that of the external address, the scale of the logic for preventing the wrong read operation due to the late write function becomes relatively large.

Accordingly, it is an object of the invention to reduce the scale of the logic for the generation of burst address and the prevention of wrong operation in the memory having the late write function and DDR mode.

The above and other objects, and novel features of the invention will become clear from the description of this specification and the accompanying drawings.

Typical examples of the invention disclosed in this application will be outlined below.

The semiconductor memory device has a double data rate (DDR) mode in which it is possible to make an internal parallel operation on a specified memory address externally fed and a secondary memory address made different from the specified memory address by changing the last two or more bits, and an external serial input/output operation suitable with the internal parallel operation so that when an address comparing means of the semiconductor memory device detects that the specified memory address or the secondary memory address for a reading operation matches the specified memory address latched in an address register of the semiconductor memory device or the secondary memory address in a preceding writing operation, data corresponding to the matching memory address can be fed to the outside from a data register of the semiconductor memory device. At this time, the address comparing means includes a first comparison logic circuit formed of combined circuits by which the last two or more bits of the specified memory address for a reading operation can be compared with the last two or more bits of the specified memory address for the preceding writing operation, a second comparison logic circuit formed of combined circuits that can detect if the bits other than the last two or more bits of the specified memory address for a reading operation respectively match the bits other than the last two or more bits of the specified memory address for the preceding writing operation, and a third comparison logic circuit formed of combined circuits which can detect that, when a match is obtained as the result from the second comparison logic circuit, the last two or more bits of the specified memory address or the secondary address for a reading operation match the last two or more bits of the specified memory address or the secondary memory address for the preceding writing operation, on the basis of the result from the first comparison logic circuit.

Even when the read address matches the burst address of the preceding write cycle, the address comparing means causes the read data of the matched burst address to be produced in response to this read address, thus preventing the erroneous operation due to the fact that the data to be scheduled to be rewritten but not yet written in memory cells are not read out because of the late write function.

In addition, the address comparing means for that purpose includes first through third logic circuits each of which is fundamentally formed of combined circuits. Also, the secondary memory address is not directly produced, and does not need to be directly held in a sequence circuit. Thus, the DDR-mode memory having the late write function can be reduced in its logic scale for burst address generation and malfunction prevention.

The DDR mode makes it possible that, in response to an order to perform the reading operation, data in the specified memory address and the secondary memory address are read in parallel from a memory cell array of the semiconductor memory device and then serially supplied to the outside with a period of 1/2 cycle of a clock signal, and it may be an operation mode in which, in response to an order to perform the writing operation, write data in the data register can be written in the specified memory address held in the address register and the secondary memory address in parallel, write data serially fed from the outside with a period of 1/2 cycle of the clock signal can be newly latched in the data register, and the specified memory address for the latched data can be newly latched in the address register.

The present invention is most suitable for SRAM of relatively short access cycle if it is based on the late write function, and in that case the memory cell array has static type memory cells arranged in a matrix shape.

More specifically, when the last two or more bits are the last two bits, the memory cell array has two memory mats. An address decoder of the semiconductor memory device provided to select memory cells from the two memory mats, in the DDR mode, selects memory cells specified by an input address signal from one memory mat, and at the same time selects, from the other memory mat, memory cells specified by the secondary memory address generated by changing the last two bits of the input address signal according to a predetermined logic. Thus, since the secondary memory address can be selected by applying the address decoding logic, the logic scale is reduced.

Moreover, when the address decoder has a linear mode and interleave mode for the determination of the secondary memory address, those modes can be switched by a first mode signal.

At this time, the third comparison logic circuit can be formed of, for example, a first logic circuit portion for match detection in the linear mode in which the secondary address is determined, a second logic circuit portion for the match detection in the interleave mode in which the secondary memory address is determined, and a selector for selecting the output from the first logic circuit portion or second logic circuit portion in response to the first mode signal.

When the semiconductor memory device further has an SDR mode in which a single piece of data can be read or written in each operation cycle with respect to the specified memory address from the outside, the address decoder is stopped from addressing according to the secondary memory address in the SDR mode.

When the semiconductor memory device has the SDR mode and DDR mode, the address comparing means further can have a register for latching SDR/DDR mode information indicating if the operation mode is either the SDR mode or the DDR mode in response to a writing cycle, and a control logic circuit that decides how the access modes for a read address and a preceding write address to be compared are combined according to the relation between the SDR/DDR mode information in a read cycle and SDR/DDR mode information latched in the register, and controls the match detection logic functions of the first and second logic circuit portions according to the decision result.

The invention of a data processing system using the semiconductor memory device employs the semiconductor memory device as a main memory or cache memory for main memory or work memory. In other words, the data processing system has the semiconductor memory device and a data processor that can perform computation control by executing commands and control to access said semiconductor memory device as a main memory. Another data processing system has a main memory, a data processor that can make computation control by executing commands, and control to access the main memory, and the semiconductor memory device that can be used as a cache memory for the main memory. Thus, the work station or personal computer system using this data processing system can improve the reliability in the data processing or computation control processing.

DESCRIPTION OF THE EMBODIMENTS

<<Block diagram of SRAM>>

Figure 1:
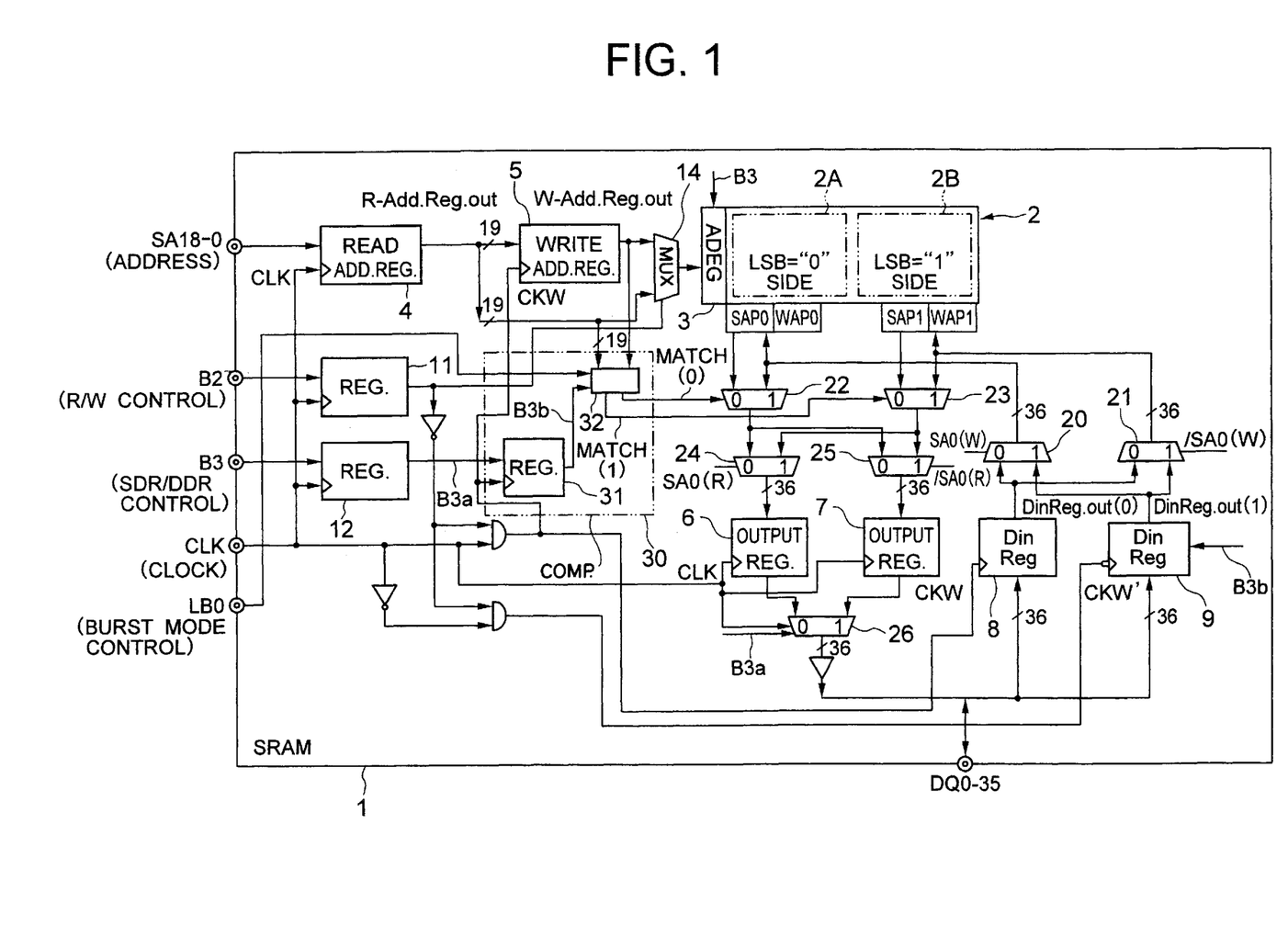
FIG. 1 is a block diagram of an SRAM as one embodiment of a semiconductor memory device according to the invention.

FIG. 1 is a diagram showing an SRAM as one embodiment of a semiconductor memory device according to the invention. The SRAM represented by reference numeral 1 in FIG. 1 is a clock-sync type synchronous SRAM capable of selecting DDR mode or SDR mode. This SRAM 1 can be built up as a single-unit memory large scale integration (LSI) in a single semiconductor chip of, for example, single-crystal silicon by the well-known complementary metal oxide semiconductor (CMOS) circuit production technique. The SRAM 1 receives an external address signal SA18–0, read/write control signal B2, SDR/DDR mode control signal B3 that indicates an operation mode of either DDR or SDR mode, clock signal CLK and burst mode control signal LBO, and receives/produces data DQ0–35.

The SRAM 1, in order to perform clock-sync operation, has registers 4, 11 and 12 that respectively latch the external address signal SA18-0, read/write control signal B2 and SDR/DDR mode control signal B3 in synchronism with the clock signal CLK. The latch circuits or register circuits in this specification latch in synchronism with the leading edges of signals to the clock terminals (indicated by symbol ">" in FIG. 1). The clock signal CLK is used as a reference for the memory cycle of SRAM 1. A control clock signal CKW that is generated on the basis of the clock signal CLK results from the logic product (AND) of the inversion of the output from the register 11 and the clock signal CLK, and thus occurs as a clock in the clock signal CLK cycle next to the write cycle. Another control clock signal CKW' results from the logic product (AND) of the inversion of the output from the register 11 and the inversion of the clock signal CLK, and thus occurs as a clock a half cycle after the control clock signal CKW.

The SRAM 1 includes a memory cell array 2 that has static memory cells of chiefly the well-known resistance-load type or CMOS inverter-type static latches arranged in a matrix shape. Although not particularly shown, the data input/output terminals and selection terminals of the static memory cells are connected to the bit lines of complementary configuration and word lines, respectively. The bit lines are connected through a column switch circuit not shown to sense amplifiers SAP0, SAP1 and write amplifiers WA0, WAP1. The selection of word lines, and selecting operation of the column switch circuit are controlled by a selection signal from an address decoder (ADEC) 3.

Here, although not particularly limited to, the memory cell array 2 is divided into first and second memory mats 2A, 2B, the sense amplifier SAP0 and write amplifier WAP0 are assigned to the memory mat 2A, and the sense amplifier SAP1 and write amplifier WAP1 to the memory mat 2B. Although not particularly limited to, the memory mat 2A is used as a data recording region corresponding to the address signal that has a logic value of "0" at the least significant bit, and the memory mat 2B as a data recording region corresponding to the address signal that has a logic value of "1" at the least significant bit. The assignment of these data recording regions to the address is decided by the decoding logic of the address decoder 3.

The decoding logic of the address decoder 3 decides differently for the DDR mode and SDR mode by switching on the basis of a mode signal B3. In the DDR mode, the address decoder 3 enables the addressing operation using the secondary address (burst address) derived from the input address with the two last bits made different in addition to the addressing operation using the input address. In other words, in the DDR mode, the address decoder 3 operates to select, from one memory block, memory cells specified by the address signal fed from a multiplexer 14, and at the same time from the other memory block, the memory cells corresponding to the secondary address that results from changing the two last bits of the input address signal according to a certain logic. Therefore, the memory mats 2A and 2B of memory cells can be written and read in parallel in the DDR mode. In the SDR mode, the address decoder 3 stops the operation of the addressing function using the burst address.

The SRAM 1 of FIG. 1 has the address registers 4, 5 connected in series, and output registers 6, 7 and input data registers 8, 9 respectively provided to be connected to the memory mats 2A, 2B in order to support the late write function in DDR mode.

The address register 4 receives the external address signal SA18–0 in synchronism with the clock signal CLK cycle, and the address register 5 latches the write address, that is latched in the register 4 in the write cycle, in the next clock cycle. The multiplexer 14 selects the output from the address register 5 in the write cycle, and the output from the address register 4 in the read cycle, and supplies those outputs to the address decoder 3. Here, the write cycle means the cycle of clock signal CLK in which the write operation is ordered by the low level of the read/write signal B2, and the read cycle means the cycle of clock signal CLK in which the read operation is ordered by the high level of the read/write signal B2.

The input data registers 8, 9 latch, the write data fed in the write cycle, in synchronism with the control clocks CKW, CKW', respectively. The input data register 9 is controlled to have a high output impedance in response to the SDR mode. The control on the input data register 9 is ordered by a mode signal B3b which will be described later.

The outputs from the input data registers 8, 9 are supplied through left and right selectors 20, 21 to the left and right write amplifiers WAP0, WAP1, respectively. Since the addresses to the first and second memory mats 2A, 2B are decided by the logic value of the least significant bit of the input address as described previously, the selectors 20, 21 are provided in order that data can be supplied to the appropriate memory mat according to the logic value of the least significant bit of the address to the data sequentially latched in the input data registers 8, 9. The selectors 20, 21 are controlled to select by the least significant bit SA0 (W) and its inversion signal /SA0 (W) of the address signal fed from the address register 5, respectively.

The outputs from the selectors 20, 21 and the outputs from the sense amplifiers SAPO, SAP1 can be selected, and the selected signals are supplied through left and right selectors 24, 25 to the output data registers 6, 7. The function of the selectors 24, 25 is the same as that of the selectors 20, 21, and these selectors are controlled to select by the least significant bit SA0 (R) and its inversion signal /SA0 (R) of the address signal fed from the address register 4. The outputs from the output data registers 6, 7 are alternately selected by a selector 26 at each half cycle of the clock signal CLK so that they can be produced serially. The selector 26, when the SDR mode is notified by the mode signal B3a, fixedly selects one input, for example, the input on the "1" side. The values of "1", "0" attached to the input terminals of the selectors 20 through 26 mean, as a general rule, the logic values of the selection control signal for selecting the input terminals with those values attached.

The selectors 22, 23 enable the data latched in the input data registers 20, 21 to be read when the data latched in the input data registers 20, 21 but not yet written in the memory array 2 are ordered to read. The selection control is performed by an address comparator circuit 30.

The address comparator circuit 30 detects the condition in which the specified memory address fed from the register 4 or the secondary memory address produced as its burst address in order to perform read operation coincides with the specified memory address latched in the address register 5 in the previous write operation or the secondary memory address as its burst address, and controls the selectors 22, 23 to select so that the data of the coincidence-detected memory address can be transmitted from the input data register 8, 9 to the output data registers 6, 7.

<<Late Write Function>>

Figure 2:
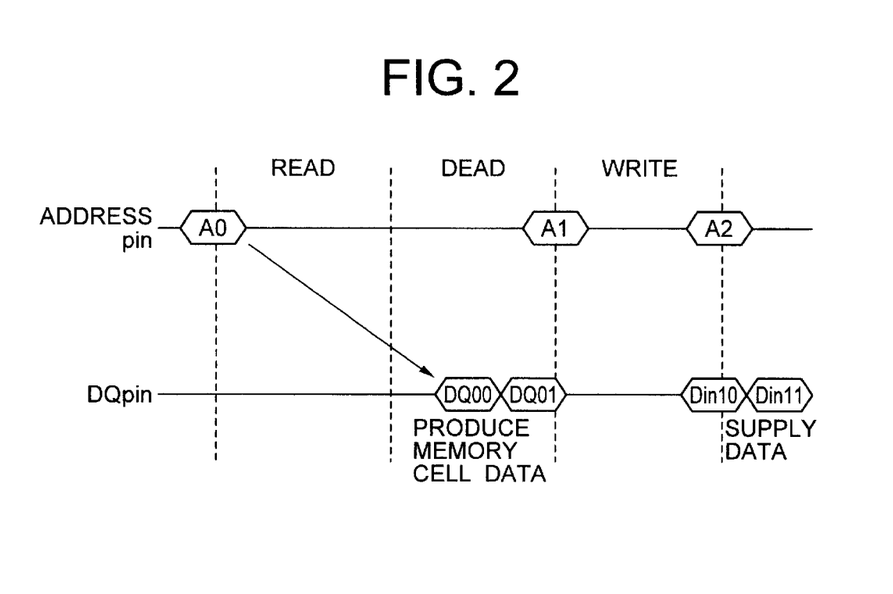
FIG. 2 is a schematic diagram showing the late write function in the SRAM of FIG. 1.

The late write function in the SRAM 1 will be described with reference to FIG. 2. When a read cycle (READ) occurs as to a read address A0, the SRAM 1 operates so that read data DQ00, DQ01 are actually supplied to the outside in the next cycle (DEAD). At this time, as the next cycle (WRITE) is shown as the write cycle, the input timing of write data Din10, Din11 to the write address A1 is decided in the next cycle in order that the write data Din10, Din11 cannot collide with the read data DQ00, DQ01 at the external input/output terminal (DQpin). The actual output timing of read data is associated with the operation speed of SRAM. There is an SRAM in which the read data is obtained at the beginning of the next cycle to the read cycle. In this case, the cycle (DEAD) shown in FIG. 2 is not necessary to insert just after the read cycle or just before the write cycle.

<<Memory Operation in DDR Mode/SDR Mode>>

Before the detailed description of the address comparator circuit 30, the memory operations in DDR mode and SDR mode will be mentioned first.

The DDR mode is brought about by the signal B3. In the DDR mode, the address decoder 3 receives the address signal from the multiplexer 14. It selects memory cells specified by the address from one memory block, and at the same time operates so that the memory cells specified by the secondary memory address generated by changing the two last bits of the input address signal according to a certain logic can be selected from the other memory block. Therefore, in the DDR mode, both the memory mats can be simultaneously written and read to memory cells.

In the write cycle of DDR mode, the address signal SA18–0 is latched in the address register 4, and the write address already latched in the address register 5 is fed through the multiplexer 14 to the address decoder 3, thus this address signal and the secondary address are used to address both memory mats. At this time, the write data already latched in the input data registers 8, 9 are simultaneously supplied through the write amplifiers WAP0, WAP1 to both memory mats 2A, 2B, and stored in the corresponding memory cells. The write data fed to the data terminal DQ0–35 in this write cycle are latched in the input registers 8, 9 in the next clock signal CLK cycle, and wait for the write timing in which the next write operation is ordered. This late write function enables the read data and write data to be prevented from colliding at the data terminal DQ0–35.

In the read cycle of DDR mode, the address signal SA18–0 is supplied from the address register 4 to the address decoder 3, and the address according to the address signal SA18–0 and the secondary address are used to specify the corresponding memory cells of both memory mats 2A, 2B. At this time, when the outputs from the sense amplifiers SAP0, SAP1 are selected by the selectors 22, 23, the read data from the sense amplifiers SAP0, SAP1 are latched in parallel by the output latch circuits 6, 7, and then the outputs from the registers 6, 7 are respectively selected at each half cycle of clock signal CLK. Thus, two pieces of read data are serially supplied to the data terminal DQ0–35 in one cycle of clock signal CLK. When one or both of the outputs from the input data registers 8, 9 are selected to the selectors 22, 23, the corresponding one or both of the outputs from the input registers 8, 9 are latched by the output data registers 6, 7 in parallel in place of one or both of the outputs from the sense amplifiers SAP0, SAP1. Then, the outputs from the output data registers 6, 7 are respectively selected at each half cycle of clock signal CLK, and thus two pieces of read data are serially supplied to the data terminal DQ0–35 in one cycle of clock signal CLK.

When SDR mode is selected, the address decoder 3 makes addressing operation according to only the input address from the multiplexer 14, but does not make addressing operation according to the burst address. Moreover, in the SDR mode, the input data register 9 is brought to a high output impedance state, and the selector 26 can select only the output from the output data register 6. Thus, only the write data latched in the input data register 8 in the write cycle can be supplied through the output data register 6 to the outside in the subsequent read cycle to the same address. The read data from the memory array 2 can also supplied through the output data register 6, and the data latched in the input data register 8 can also be supplied to the memory cell array 2.

<<Address Comparator Circuit>>

Figure 3A:
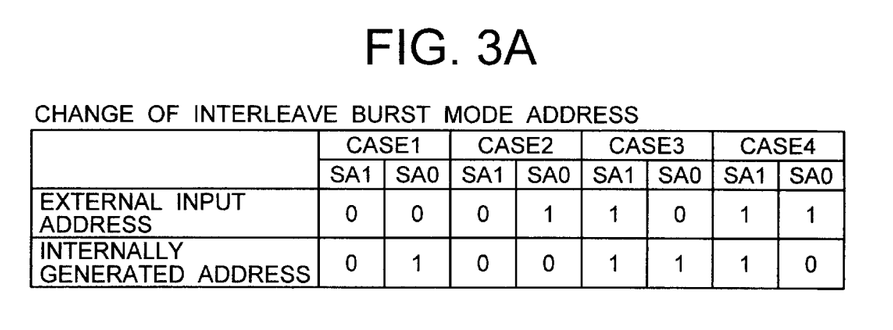
FIGS. 3A and 3B are diagrams respectively showing the interleave-burst mode and linear-burst mode between which the burst address can be switched.
Figure 3B:
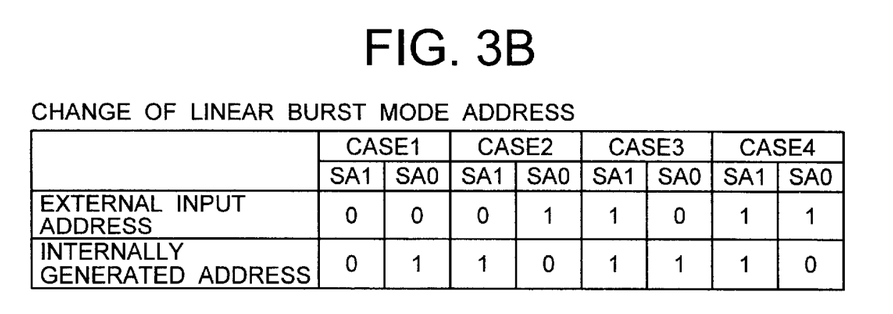

FIGS. 3A and 3B are tables showing the change of the last two bits of the burst address. FIG. 3A shows the change of the last two bits SA0, SA1 of the address in the interleave burst mode, and FIG. 3B the change of the last two bits SA0, SA1 of the address in the linear burst mode. The external input address means the externally specified address fed from the multiplexer 14, and the internal address means the secondary address as the burst address.

Figure 4:
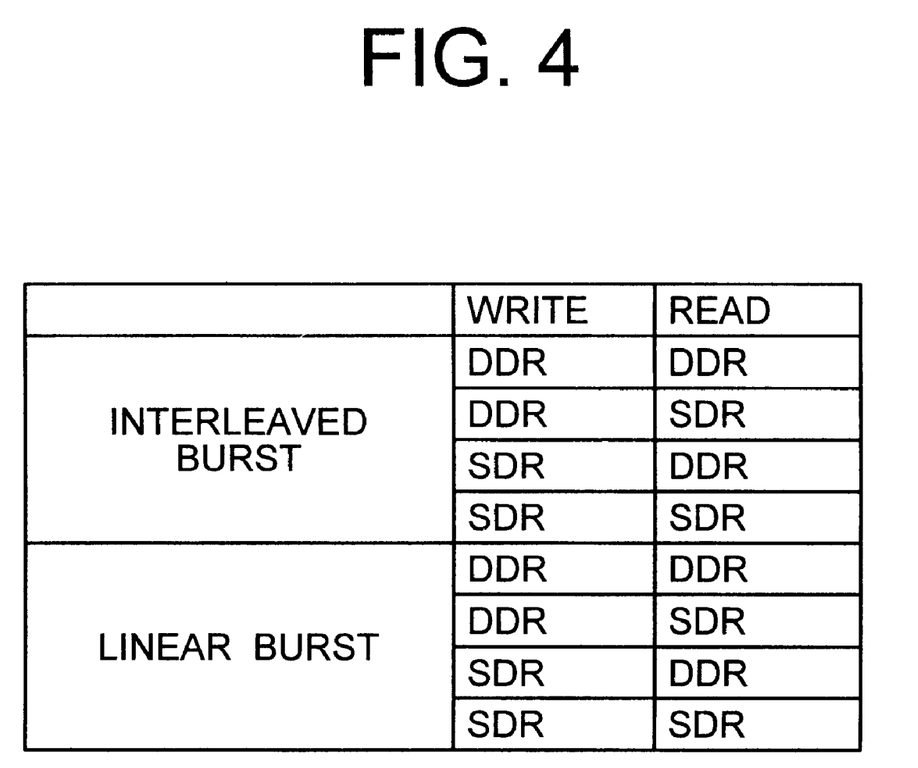
FIG. 4 is a diagram showing the possible combinations of DDR mode and SDR mode in each of the read operation and write operation having the interleave-burst mode and linear-burst mode.

When there are the interleave burst mode and linear burst mode as above, the read operation (READ) and write operation (WRITE) can have different combinations of DDR mode and SDR mode as shown in FIG. 4.

Figure 5:
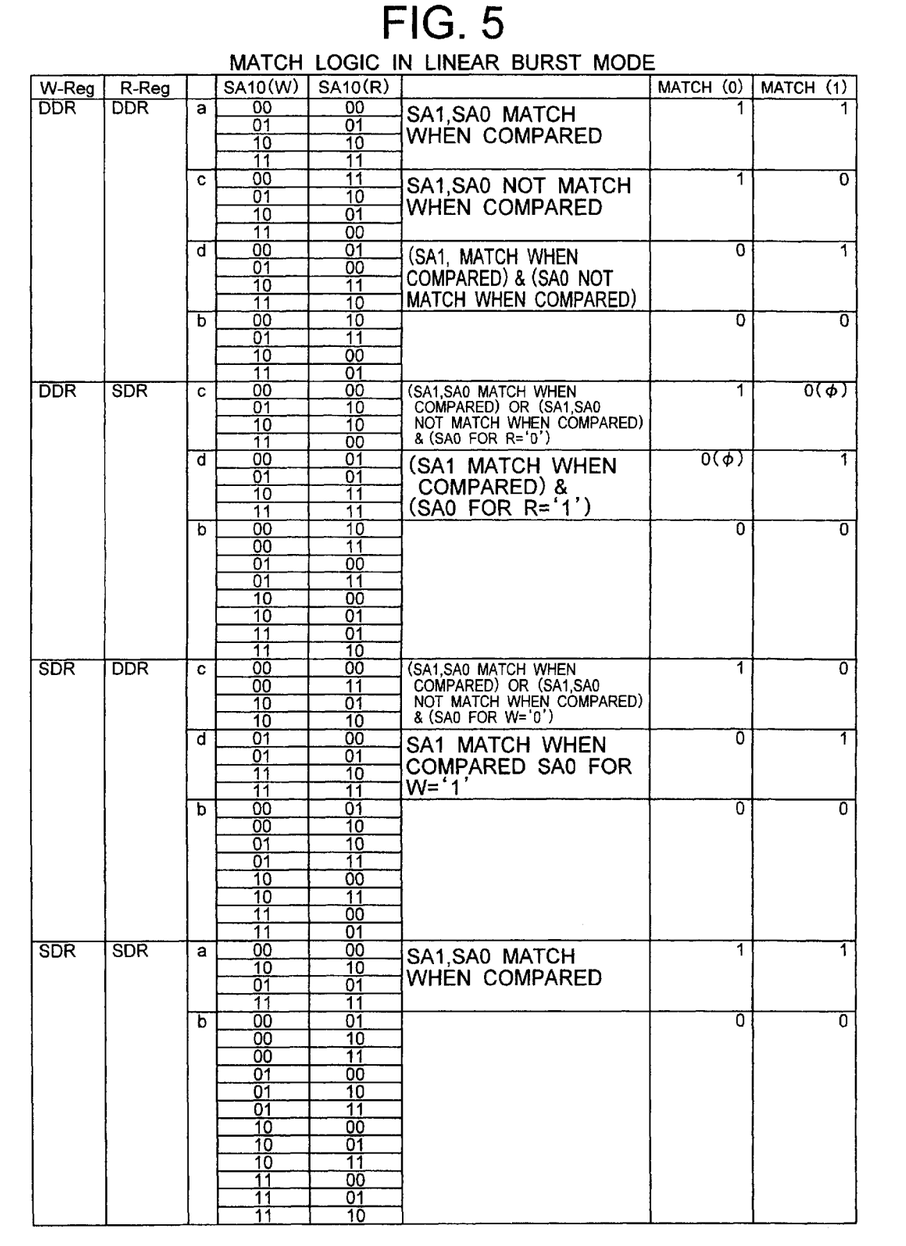
FIG. 5 is a diagram showing the truth table of the comparison switching logic to be performed in an address comparator circuit of the SRAM in FIG. 1.

FIG. 5 shows the truth table of the comparison switching logic the address comparator circuit 30 tries to make. The address comparator circuit 30 considers the relation between the write address latched in the address register 5 and the read address latched in the address register 4, and decides if the data to be read at the specified address and burst address are held in the input data registers 8, 9. If even one piece of data is held, the address comparator circuit controls the selectors 22, 23 so that the latched data can be fed to the outside.

In FIG. 5, W-Reg represents the address register 5, R-Reg the address register 4, SA10 (W) the last two bits SA1, SA0 within the register 5, and SA10 (R) the last two bits SA1, SA0 within the register 4. In addition, MATCH (0) designates the selection signal to the selector 22, and MATCH (1) the selection signal to the selector 23. As illustrated in FIG. 5, the values that the MATCH (0) and MATCH (1) can take are listed for all the combinations of SA10 (W) and SA10 (R) to each combination of operation modes (DDR mode, SDR mode) in which the reading operation and the preceding writing operation are performed. Here, the linear burst mode is assumed to be the mode being performed. For example, since the specified address and the burst address completely coincide when SA10 (W)=00, SA10 (R)=00 in a combination a to DDR, DDR mode, MATCH (0)=1 and MATCH (1)=1 can be obtained, thus indicating that the input "1" side is selected in both selectors 22, 23. As another example, both the bits SA1 and bits SA0 do not match when SA10 (W)=00 and SA10 (R)=11 in a combination of c to DDR, DDR mode, and thus correspond to case 1 and case 4 in FIG. 3B. Therefore, the specified address in case 1 matches the burst address in case 4. This means that the specified address to the data of register 8 coincides with the burst address to the specified address of register 4, or MATCH (0)=1 and MATCH (1)=0. Thus, the selector 22 selects data of register 8, and the selector 23 selects the read data from the memory mat 2B.

Figure 6:
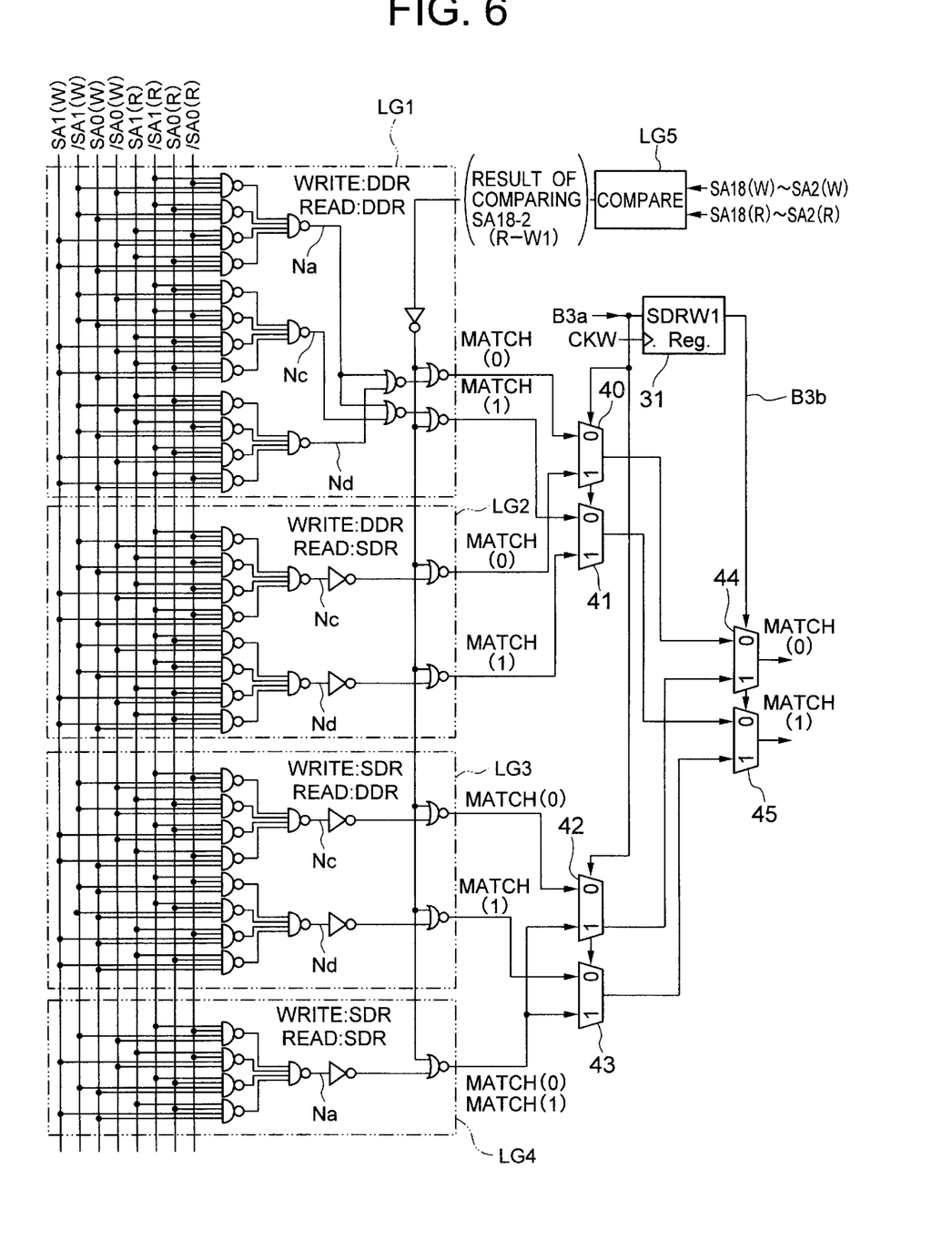
FIG. 6 is a diagram of a logic circuit arrangement constructed according to the truth table of FIG. 5.

FIG. 6 is a diagram showing an example of the logic circuit arrangement equivalent to the truth table of FIG. 5. In FIG. 6, logic circuit LG1 corresponds to the DDR-DDR (write-read) mode, LG2 to the DDR-SDR mode, LG3 to the SDR-DDR mode, and LG4 to the SDR-SDR mode. The nodes Na, Nc, Nd of the LG1 correspond to the results a, c, d of the DDR-DDR mode in FIG. 5. The nodes Nc, Nd of the LG2 correspond to the results c, d of the DDR-SDR in FIG. 5. The nodes of the other modes are the results of the corresponding modes. The values MATCH (0) and MATCH (1) other than the values corresponding to the nodes Na, Nc, Nd shown in FIG. 5 are both 0. The outputs from the logic circuits LG1 through LG4 shown in FIG. 6 are made valid when the more-significant side bits SA18–2 match with each other in the comparator circuit LG5. Selectors 40 through 45 determine which result of LG1 through LG4 is employed according to the states of the successive operating modes. The selectors 40 through 43 are controlled to select by the mode signal B3a, and the selectors 44 and 45 are controlled to select by the mode signal B3b fed from the register 31.

The register 31 latches the mode signal B3a in synchronism with the control clock that is changed in response to the write cycle. In short, the register 31 latches information B3a indicating if data is written in the data register 8, 9 in either DDR mode or SDR mode.

The logic circuits LG1 through LG5 and selectors 40 through 45 shown in FIG. 6 can be used as an example of the circuit block 32 in FIG. 1.

Figure 7:
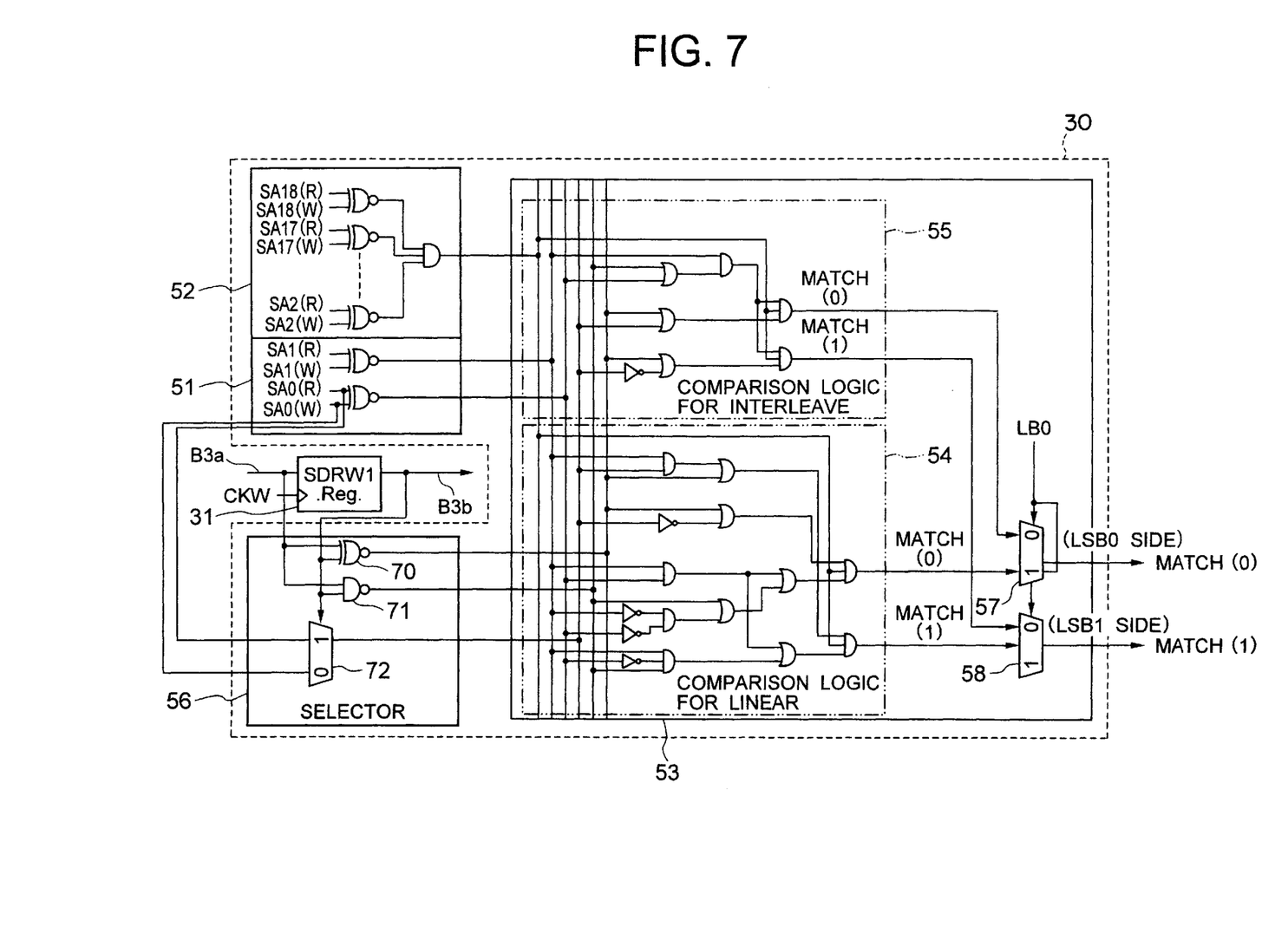
FIG. 7 is a diagram of a logic circuit arrangement showing the address comparator circuit of which the logic scale is reduced by use of the comparison switching logic of FIG. 5.

FIG. 7 shows an example of the address comparator circuit 30 with its logic scale reduced. The circuit arrangement of the address comparator circuit shown in FIG. 7 has its circuit scale more reduced than that of FIG. 6.

The address comparator circuit 30 of FIG. 7 includes a first comparison logic circuit 51, a second comparison logic circuit 52, a third comparison logic circuit 53, a control logic circuit 56, and the register 31 previously described.

The first comparison logic circuit 51 includes combined circuits capable of comparing the last two bits SA0 (R), SA1 (R) of the specified memory address for reading operation and the last two bits SA0 (W), SA1 (W) of the specified memory address for writing operation, for example, an exclusive NOR circuit for comparing SA0 (R) and SA0 (W), and an exclusive NOR circuit for comparing SA1 (R) and SA1 (W). The exclusive NOR circuits generate a logic value of "1" when the input bits match.

The second comparison logic circuit 52 include combined circuits capable of detecting if each bit SA2 (R) through SA18 (R) except the last two bits of the specified memory address for reading operation matches with each bit SA2 (W) through SA18 (W) except the last two bits of the specified memory address for the writing operation that precedes the reading operation, or specifically it includes a plurality of exclusive NOR circuits for deciding if the corresponding bits match, and an AND circuit that receives all the outputs from the exclusive NOR circuits.

The third comparison logic circuit 53 includes combined circuits capable of detecting if the last two bits SA0 (R), SA1 (R) of the specified memory address for reading operation or the last two bits of the secondary address (burst address) match the last two bits SA0 (W), SA1 (W) of the specified memory address for the writing operation that precedes the reading operation or the last two bits of the secondary address (burst address) on the basis of the compared results from the first comparison logic circuit 51 when the first comparison logic circuit 51 generates matched results.

Since the burst address has two modes of interleave mode and linear mode, the third comparison logic circuit 53, in order to deal with both modes, includes a first logic circuit portion 54 that makes the matching detection for the case in which the secondary memory address complies with the linear mode, a second logic circuit portion 55 that performs the match detection for the case in which the secondary memory address complies with the interleave mode, and selectors 57, 58 for selecting the outputs from the first logic circuit portion 54 or the second logic circuit portion 55 in response to the mode signal LBO.

The address comparator circuit further has the register 31 and the control logic circuit 56 in order to meet the requirement that the operation mode of the SRAM 1 is roughly divided into DDR mode and SDR mode, and to deal with various combinations of access modes of the read address and the preceding write address to be compared. The register 31 latches the mode information B3a indicating if the operation mode is SDR or DDR in response to the write cycle. The control logic circuit 56 decides how the access modes of the read address and preceding write address to be compared are combined according to the relation between the mode information B3a of the read cycle and the mode information B3b latched in the register 31, and controls the matching detection logic function of the first and second logic circuit portions 54, 55. For example, an exclusive NOR circuit 70 included in the control logic circuit 56 distinguishes the matching between the access modes (DDR-DDR, SDR-SDR) of the read address and preceding write address to be compared from the mismatching between those modes (DDR-SDR, SDR-DDR). A NAND circuit 71 includes in the control logic circuit 56 distinguishes the combination DDR-DDR of access modes from other combinations (SDR-SDR, DDR-SDR, SDR-DDR). A selector 72 selects SA0 (R) when the writing is made in the DDR mode and SA0 (W) when the writing is made in the SDR mode. This control logic circuit 56 lets the first and second logic circuit portions 54, 55 know about the fact that the combination is DDR-DDR when the output of exclusive NOR gate 70="1" and the output of NAND gate 71="1", SDR-SDR when the output of exclusive NOR gate 70="1" and the output of NAND gate 71="0", DDR-SDR when the output of exclusive NOR gate 70="0", 71="0" and the output of selector 72=SA0 (R), and SDR-DDR when the output of exclusive NOR gate 70="0", the output of NAND gate 71="0" and the output of selector 72=SA0 (W). Thus, the circuits 51, 52, 54, 31, 56 implement the comparison decision logic according to the truth table in FIG. 5, and achieve the functions equivalent to the circuits of FIG. 6. The circuits 51, 52, 55, 31, 56 execute the comparison decision logic in the interleave burst mode though not particularly shown. The arrangement of FIG. 7 is remarkably reduced in its circuit scale or logic scale as will be clear when compared with that of FIG. 6.

Figure 8:
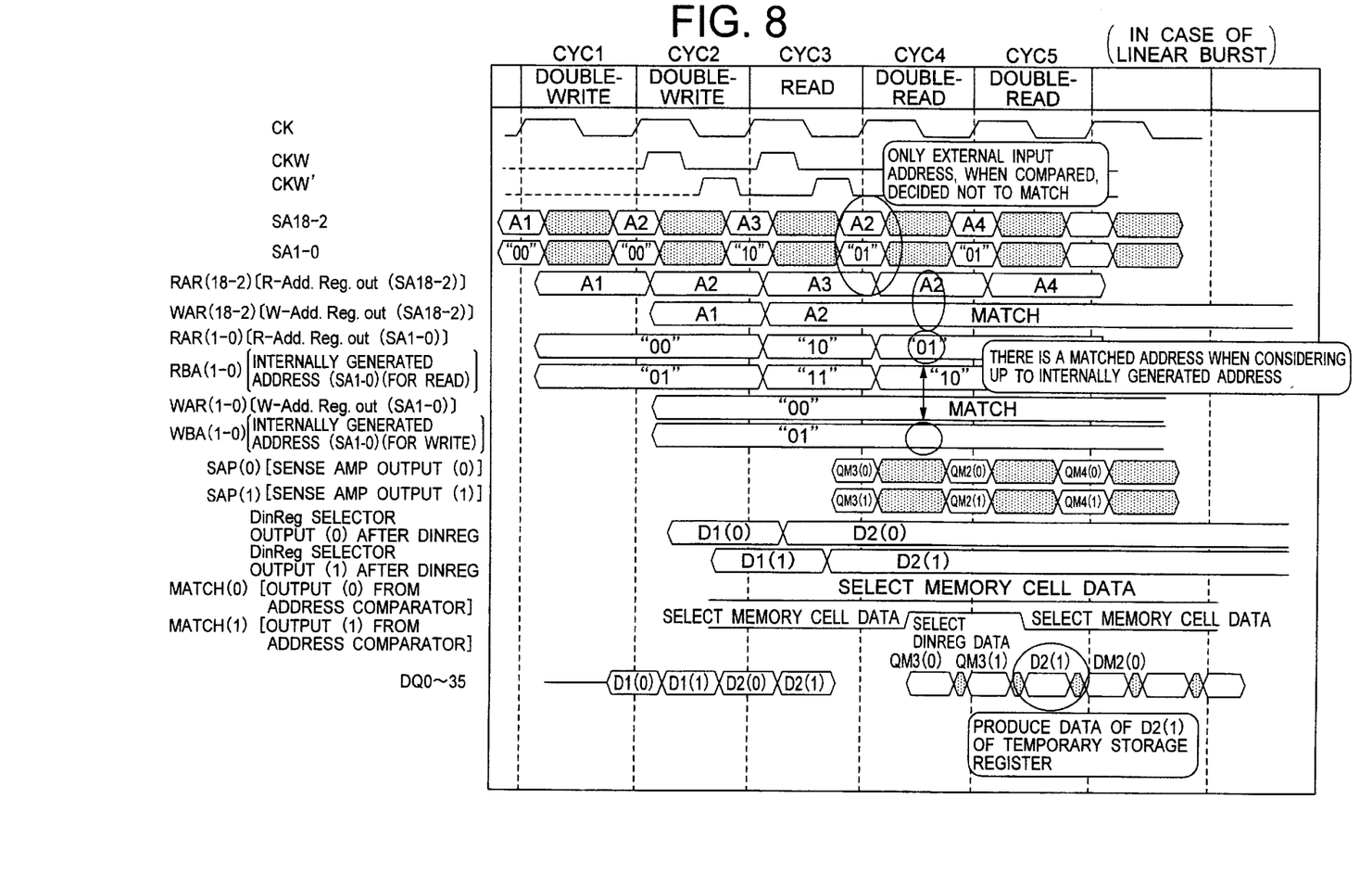
FIG. 8 is a timing chart showing the operation timing of the SRAM of FIG. 1.

FIG. 8 is a timing chart of the operation of the SRAM 1. In FIG. 8 it is assumed that DDR mode and linear burst mode are specified. In a write cycle CYC1, write address A1, "00" are fixed at the beginning, and in the next write cycle CYC2, write data D1 (0) and D1 (1) are supplied. In the write cycle CYC2, write address A2, "00" are fixed at the beginning, and in the next cycle CYC3, write data D2 (0) and D2 (1) are supplied. In the read cycle CYC3, read address A3, "10" are fixed at the beginning. In this read cycle CYC3, the write address A2, "00" in the write cycle CYC2 are latched in the most- and more-significant bits (bit 2 through bit 18) (WAR (18–2)) positions and the last two bits (bit 0 and bit 1) (WAR (1–0)) positions of the address register 5, and the write data D2 (0), D2 (1) in the write cycle CYC2 are latched in the data registers 8, 9. This state is maintained even until the following write cycle. The cycle CYC4 is a read cycle in which read address A2, "01" are fixed. When the write address A2, "00" in the cycle CYC2 are compared with the read address A2, "01" in the cycle CYC4, the read address A2, "01" match the burst address of the write address A2, "00" in the cycle CYC2 in the linear burst mode, and thus the data held by the input register 9 is supplied to the outside in place of the read data from the memory cells in the read operation of cycle CYC4 since MATCH (1)=1. The address comparator circuit 30 also detects that the read address matches the burst address of the preceding write address, and lets the input data registers 8, 9 supply the latched data to the outside in place of the read data from the memory array 2, thus avoiding the situation that the data to be scheduled to be rewritten but not yet rewritten is read out incorrectly.

<<Data Processing System>>

Figure 9:
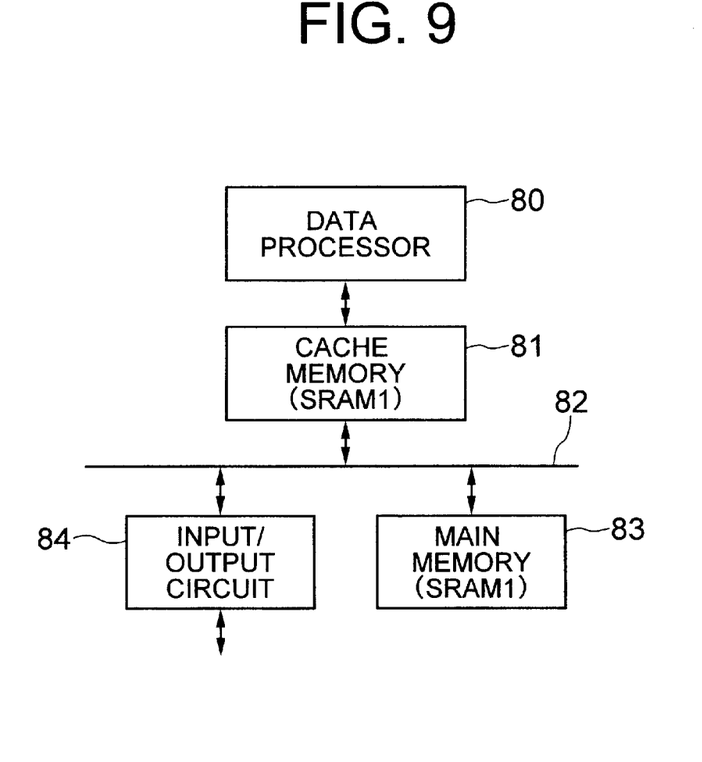
FIG. 9 is a block diagram showing a data processing system using the SRAM of FIG. 1.

FIG. 9 shows an example of the data processing system using the SRAM 1. The data processing system of FIG. 9 includes a data processor 80 for making computation control by executing commands, a cache memory 81 of the data processor 80, a system bus 82 to which the cache memory 81 is connected, a main memory 83 connected to the system bus and used as a work region or temporarily data-storing region of the data processor 80, and an input/output circuit 84 connected to the system bus 82. To the input/output circuit 84 are connected an external storage unit, keyboard and pointing device though not shown. In the data processing system shown, the SRAM 1 is used as the main memory 83 and cache memory 81. When the data processor 80 executes a predetermined program, the cache memory 81 is referred to check whether or not there is cache entry about a memory access address for fetching data. If there is a cache hit, the cache memory 81 is read or written. If there is no cache hit, the main memory 83 is accessed to. Since the SRAM 1 has the late write function by which the misreading is prevented as described above, it is possible to improve the reliability of the data processing or computation control processing in the work station or personal computer system using this data processing system. In addition, since the SRAM 1 has a logic for burst address generation and malfunction prevention reduced in its scale and has its storage capacity made large relative to the chip area, it is possible to easily increase the storage capacity of memories that can be inserted in a limited number of memory slots, and as a result the data processing speed or function can be enhanced with ease.

Figure 10:
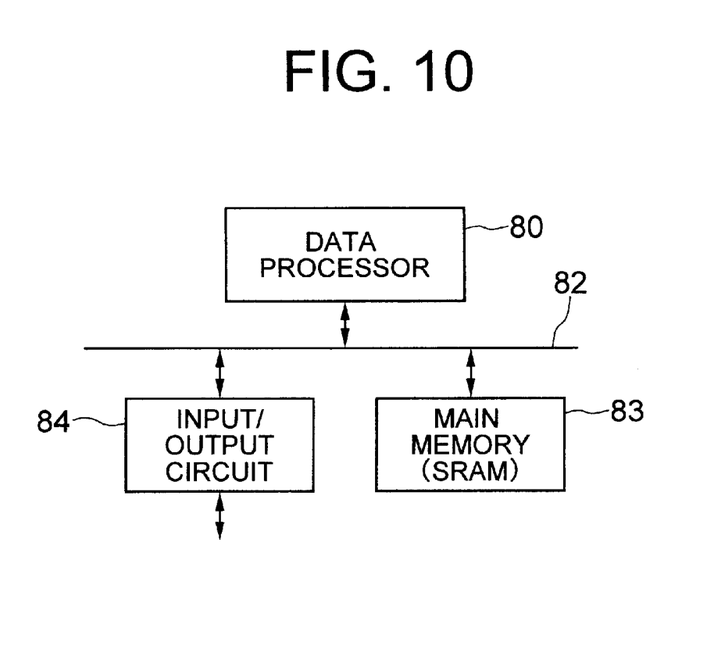
FIG. 10 is a block diagram showing another data processing system using the SRAM of FIG. 1.

FIG. 10 shows another data processing system in which the cache memory 81 in FIG. 9 is not used. This data processing system has no effect for increasing the data accessing speed since the cache memory 81 is not used, but has the same effect as in FIG. 9 in that the data processing or computation control processing reliability, and the storage capacity of memories that can be inserted in the memory slots can be improved or enhanced with ease.

While some embodiments of the present invention have so far been described in detail, the present invention is not limited to the above disclosed embodiments, but of course may be differently changed or modified without departing from the scope of the invention.

For example, while the SRAM can operate in DDR mode or SDR mode by switching, the present invention can be applied to the SRAM that operates only in the DDR mode. In addition, the present invention can be applied to the SRAM in which the operation mode is fixed to either burst mode or interleave mode. The arrangement of FIG. 7 can thus be more simplified according to the above construction modification. If the SRAM has only DDR mode, there is no need to provide the logic arrangement for the register 31 and control logic circuit 56 in FIG. 7, and instead the output from the control logic circuit 56 is fixed to a constant logic value.

Moreover, the semiconductor memory device of the invention is not limited to the memory LSI of a single SRAM, but may be used as an on-chip memory of a data processing LSI such as a cache memory, main memory or work memory that is incorporated in a microprocessor or microcomputer formed on a single semiconductor chip.

The advantageous effects that can be achieved by typical ones of the inventions disclosed by this application will be described briefly as follows.

In the semiconductor memory device having DDR mode, the specified memory address externally supplied or its burst address (secondary memory address) in order to read data is compared with the specified memory address latched in the preceding write cycle or its burst address so that decision can be made of if they match by use of address comparing means. In this case, even when the read address matches the burst address of the preceding write cycle, the read data of the burst address that matches the read address is produced, and thus the data that is scheduled to be rewritten but not yet written in memory cells because of the late write function can be prevented from being not read, or malfunction can be prevented from occurring.

In addition, the address comparing means is fundamentally constructed by a first through third logic circuits combined, and it does not directly generate the secondary address and has no need to directly hold the secondary memory address in the sequence circuits.

Therefore, the memory having the late write function and DDR mode is able to reduce the scale of its logic for burst address generation and malfunction prevention.

What is claimed is:

1. A semiconductor memory device having a double data rate (DDR) mode in which it is possible to make an internal parallel operation on a specified memory address externally fed and a secondary memory address made different from said specified memory address by changing the last two or more bits, and an external serial input/output operation suitable with said internal parallel operation so that when an address comparing means of said semiconductor memory device detects that said specified memory address or said secondary memory address for a reading operation matches said specified memory address latched in an address register of said semiconductor memory device or said secondary memory address in a preceding writing operation, data corresponding to the matching memory address can be fed to the outside from a data register of said semiconductor memory device, wherein said address comparing means comprises:
a first comparison logic circuit formed of combined circuits by which said last two or more bits of said specified memory address for a reading operation can be compared with said last two or more bits of said specified memory address for the preceding writing operation;
a second comparison logic circuit formed of combined circuits that can detect if the bits other than said last two or more bits of said specified memory address for a reading operation respectively match the bits other than said last two or more bits of said specified memory address for the preceding writing operation; and
a third comparison logic circuit formed of combined circuits which can detect that, when a match is obtained as the result from said second comparison logic circuit, said last two or more bits of said specified memory address or said secondary address for a reading operation match said last two or more bits of said specified memory address or said secondary memory address for the preceding writing operation, on the basis of the result from said first comparison logic circuit.

2. A semiconductor memory device according to claim 1, wherein said DDR mode makes it possible that, in response to an order to perform said reading operation, data in said specified memory address and said secondary memory address are read in parallel from a memory cell array of said semiconductor memory device and then serially supplied to the outside with a period of 1/2 cycle of a clock signal, and that in response to an order to perform said writing operation, write data in said data register is written in said specified memory address held in said address register and said secondary memory address in parallel, write data serially fed from the outside with a period of 1/2 cycle of said clock signal is newly latched in said data register, and said specified memory address for the latched data is newly latched in said address register.

3. A semiconductor memory device according to claim 2, wherein said memory cell array has static type memory cells arranged in a matrix shape.

4. A semiconductor memory device according to claim 2 or 3, wherein said last two or more bits are the last two bits, said memory cell array has two memory mats, and an address decoder of said semiconductor memory device provided to select memory cells from said two memory mats selects memory cells specified by an input address signal from one memory mat, and at the same time selects from the other memory mat, memory cells specified by said secondary memory address generated by changing the last two bits of said input address signal according to a predetermined logic.

5. A semiconductor memory device according to claim 4, wherein said address decoder has a linear mode and an interleave mode for the determination of said secondary memory address, which can be switched by a first mode signal.

6. A semiconductor memory device according to claim 5, wherein said third comparison logic circuit has a first logic circuit portion for match detection in said linear mode in which said secondary memory address is determined, a second logic circuit portion for match detection in said interleave mode in which said secondary memory address is determined, and a selector for selecting the output from said first logic circuit portion or second logic circuit portion in response to said first mode signal.

7. A semiconductor memory device according to claim 4, further having an SDR mode in which a single piece of data can be read or written in each operation cycle with respect to said specified memory address from the outside, wherein said address decoder is stopped from addressing according to said secondary memory address in said SDR mode.

8. A semiconductor memory device according to claim 6, wherein said address comparing means further has a register for latching an SDR/DDR mode information indicating if the operation mode is either said SDR mode or said DDR mode in response to a writing cycle, and a control logic circuit that decides how the access modes for a read address and a preceding write address to be compared are combined according to the relation between said SDR/DDR mode information in a read cycle and SDR/DDR mode information latched in said register, and controls the match detection logic functions of said first and second logic circuit portions according to the decision result.

9. A data processing system comprising a semiconductor memory device according to claim 1, and a data processor that can perform computation control by executing commands and control to access said semiconductor memory device as a main memory.

10. A data processing system comprising a main memory, a data processor that can perform computation control by executing commands and control to access said main memory, and a semiconductor memory device according to claim 1 that can be used as a cache memory for said main memory.

* * * * *